United States Patent [19]

Kim

[11] Patent Number: 5,525,532

[45] Date of Patent: Jun. 11, 1996

[54] METHOD FOR FABRICATING A SEMICONDUCTOR DEVICE

[75] Inventor: Jae K. Kim, Kyoungki-do, Rep. of Korea

[73] Assignee: Hyundai Electronics Industries Co., Ltd., Kyoungki-do, Rep. of Korea

[21] Appl. No.: 468,552

[22] Filed: Jun. 6, 1995

[30] Foreign Application Priority Data

Jun. 8, 1994 [KR] Rep. of Korea ............... 94-12821

[51] Int. Cl.$^6$ ............................................. H01L 21/8238
[52] U.S. Cl. .................... 437/56; 437/26; 437/34; 437/57
[58] Field of Search .................. 437/56, 57, 58, 437/34, 26, 41 RCM, 62, 63, 64, 67

[56] References Cited

U.S. PATENT DOCUMENTS

| | | | |
|---|---|---|---|
| 4,808,548 | 2/1989 | Thomas et al. | 437/56 |
| 5,006,476 | 4/1991 | De Jong et al. | 437/57 |
| 5,015,594 | 5/1991 | Chu et al. | 437/34 |
| 5,356,821 | 10/1994 | Naruse et al. | 437/34 |

*Primary Examiner*—Tom Thomas
*Assistant Examiner*—Michael Trinh
*Attorney, Agent, or Firm*—Morgan & Finnegan

[57] ABSTRACT

The semiconductor device comprising a P type semiconductor substrate, first and second P-wells, an N-well between the first and the second P-wells, trench element-isolating films for electrically separating the wells from each other and the first P-well from the P type semiconductor substrate, and an N type buried region formed below a first P-well between the trench element-isolating films, which is suitable to high integration and improved in operating speed.

6 Claims, 4 Drawing Sheets

METHOD FOR FABRICATING A SEMICONDUCTOR DEVICE

BACKGROUND OF THE INVENTION

1. Field of the Invention

The present invention relates, in general, to a semiconductor device and, more particularly, to improvement in the high integration of a semiconductor device as well as the operating speed thereof. Also, the present invention is concerned with a method for fabricating the semiconductor device.

2. Description of the Prior Art

CMOS (Complementary MOS) transistors are usually employed for the peripheral circuit of semiconductor memory devices because of their small power consumption and fast operating speed.

For construction of a CMOS transistor, an N-well and a P-well are first formed in a P type semiconductor substrate. Then, another P-well is formed in a predetermined portion of the N-well, to build a P type MOSFET and an N type MOSFET on the N-well and the P-well, respectively. The formation of the P-well in a predetermined portion of the N-well allows different voltages to be applied to the P type semiconductor substrate and the P-well because the N-well electrically isolates the P-well from the P type substrate.

In order to better understand the background of the present invention, a description of a conventional method for the fabrication of a semiconductor device will be given below, in connection with FIG. 1.

First, referring to FIG. 1A, there is shown an ion-implanting process taking advantage of an N-well mask. As shown in this figure, N type impurities are implanted into a predetermined area of a P type semiconductor substrate 1 covered with the N-well mask, to form an N-well region 2.

With reference to FIG. 1B, P type impurities are implanted into a predetermined area of the P type substrate 1 adjacent to an N-well region 2 and into the N-well region by use of a P-well mask, to, form a first P-well region 3A and a second P-well region 3B, both shallower than the N-well region, respectively.

With reference to FIG. 1C, element-isolating insulator films 4 are formed on the boundaries between the N-well region 2 and the first P-well region 3A and between the N-well region 2 and the second P-well region 3B by LOCOS (local oxidation of silicon) process, gate structures, each consisting of a gate oxide film 5 and a gate electrode 6, are formed on predetermined surfaces of the P-type substrate, and ion-implanting processes are carried out. For the N-well region P type impurities are implanted to give a source/drain electrode 8 and thus, obtain a P type MOSFET. On the other hand, N type impurities are implanted into the first P-well region 3A and the second P-well region 3B, to give a source/drain electrode 7 and thus, obtain N type MOSFETs.

This conventional method, however, has difficulty in achieving high integration of a semiconductor device since the element-isolating insulator films are formed along with bird's beaks by LOCOS process. In addition, the second P-well region within the N-well region contains many N type impurities as well as P type impurities, causing its N type MOSFET to be degraded in mobility.

SUMMARY OF THE INVENTION

Therefore, it is an object of the present invention to overcome the above problems encountered in prior art and to provide a semiconductor device suitable to high integration and improved in the mobility of MOSFET.

It is another object of the present invention to provide a method for fabricating the semiconductor device.

In accordance with one aspect of the present invention, there is provided a semiconductor device, comprising: a semiconductor substrate of first conductive type; a well region of second conductive type, formed in a predetermined area of said semiconductor substrate; a first well region of first conductive type and a second well region of first conductive type, each being formed beside the opposite side of said well region of second conductive type in said semiconductor substrate; trench element-isolating films which are formed at the boundaries between said well region off second conductive type and said first well region of first conductive type, between said well region of second conductive type and said second well region of first conductive type and between said second well region of first conductive type and said semiconductor substrate of first conductive type, each; and a buried region of second conductive type formed below said second well region of first conductive type and for isolating said second well region from said semiconductor substrate of first conductive type, electrically.

In accordance with another aspect of the present invention, there is provided a method for fabricating a semiconductor device, comprising the steps of: etching predetermined areas of a semiconductor substrate of first conductive type, to form trenches for isolating between well regions off different type; filling said trenches with an insulator film, to form trench element-isolating films; forming a well region of second conductive type in a first section of said semiconductor substrate sectioned by said trenches; forming a buried region of second conductive type in a second section of said semiconductor substrate, said second section being adjacent to but isolated electrically from the first section; and forming a first well region of first conductive type in a third section of said semiconductor substrate and a second well region of first conductive type above said buried region in said second section, simultaneously, said third section being adjacent to but isolated electrically from said first section.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

Figure 1A:
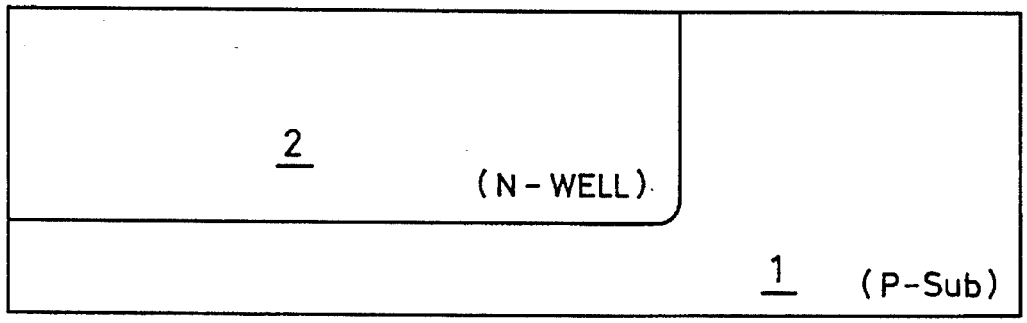
FIGS. 1A to 1C are schematic cross sectional views showing process steps of fabricating a conventional semiconductor device containing N-well and P-well.

The application of the preferred embodiments of the present invention is best understood with reference to the accompanying drawings, wherein like reference numerals are used for like and corresponding parts, respectively.

FIG. 2 shows the preferred process steps of fabricating a semiconductor device. These steps will be described in detail in connection with FIGS. 1A through 1C.

Figure 2A:
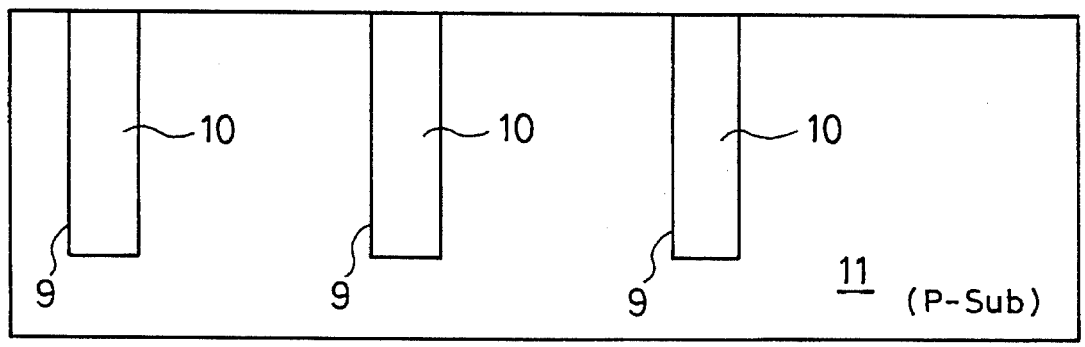
FIGS. 2A to 2D are schematic cross sectional views showing process steps of fabricating a semiconductor device containing N-well and P-well, according to the present invention.

First, as shown in FIG. 2A, trenches 9 with a depth of, for example, about 2.0 to 6.0 μm are formed in predetermined portions of a P type semiconductor substrate 11 and then filled with an insulator such as an oxide film or a nitride film, so as to give trench element isolating films 10. As will be described later, each of the trench element isolating films is located between the N-well and the P-well of CMOS, with the aim of electrically insulating the N-well from the other type wells. The element-isolating film can be formed as narrowly as possible by use of lithography.

Figure 1B:
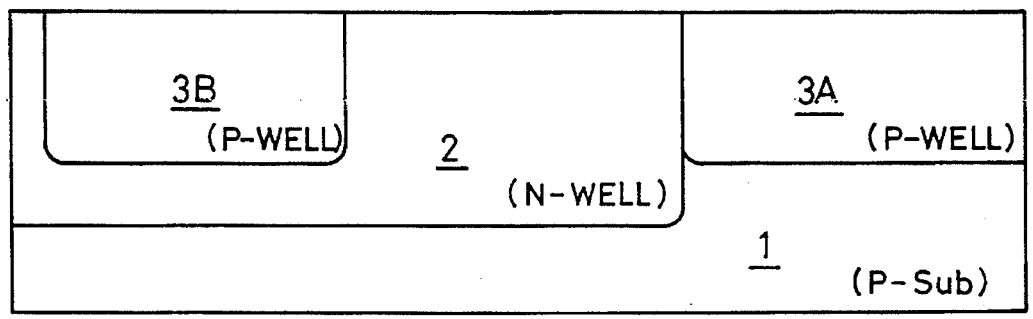
Figure 1C:
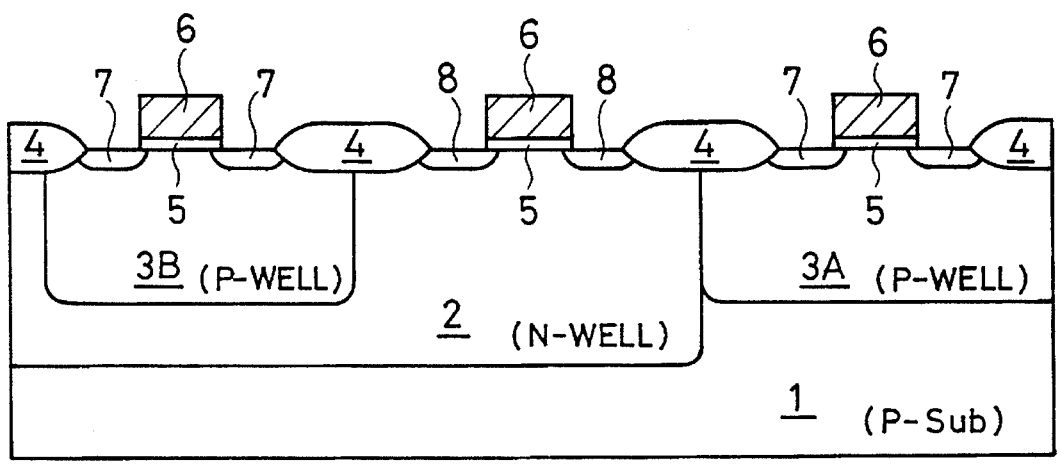
Figure 2B:
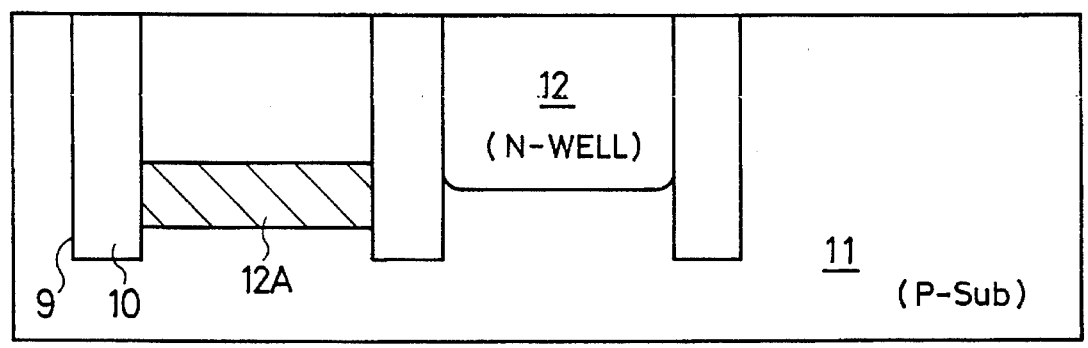

Second, with reference to FIG. 2B, phosphorous ions are implanted into the area confined by the second and the third trench element-isolating films 10, corresponding to the N-well region 2 except for the second P-well region 3B in FIG. 1B, in a concentration of, for example, $10^{16}$ cm$^{-3}$ at an implantation energy of 150 keV and then undergo a diffusion process, to form an N-well region 12 about 1.5 to 5.0 μm deep. Thereafter, N type impurities are implanted into the area confined by the first and the second trench element-isolating films 10 in a concentration of, for example, $10^{16}$ to $10^{18}$ cm$^{-3}$ at an implantation energy of 700 to 3,000 keV, to form an N type buried region 12A about 1 to 2 μm thick, at the location 3 to 4.5 μm apart from the surface of the substrate. This N type buried region electrically isolates the P type semiconductor substrate from a second P-well to be formed later. The first and the second trench element-isolating films 10 which appear separated from each other in this cross sectional view are, in fact, connected with each other in a cylindrical structure.

Figure 2C:
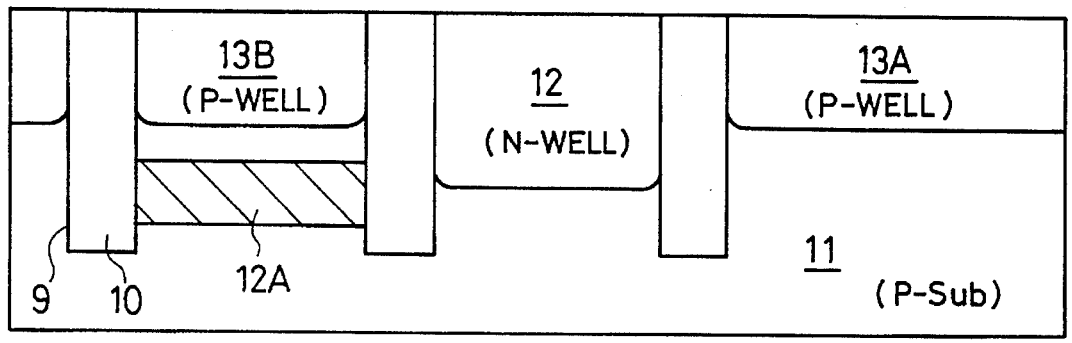

Next, with reference to FIG. 2C, P type impurities are implanted into predetermined areas of the semiconductor substrate 11, to form a first P-well region 13A and a second P-well region 13B over the N type buried region 12A. The P-well region 13A is so shallow, for example, 1.0 to 4.5 μm deep, as not to contact with the N type buried region 12A. The depth of the P-well region 13B is the same with that of the P-well region 13A. As for ion concentration the first P-well region 13A and the second P-well region 13B may be the same or different with each other, and they are formed in a concentration of about $10^{16}$ to $10^{18}$ cm$^{-3}$. As a result, the second P-well region 13B contains as little as $10^{15}$ cm$^{-3}$ of N type impurities and is electrically isolated from the semiconductor substrate 11 by the N type buried region 12A and further from adjacent N-well region 12 by the trench element-isolating films 10.

Figure 2D:
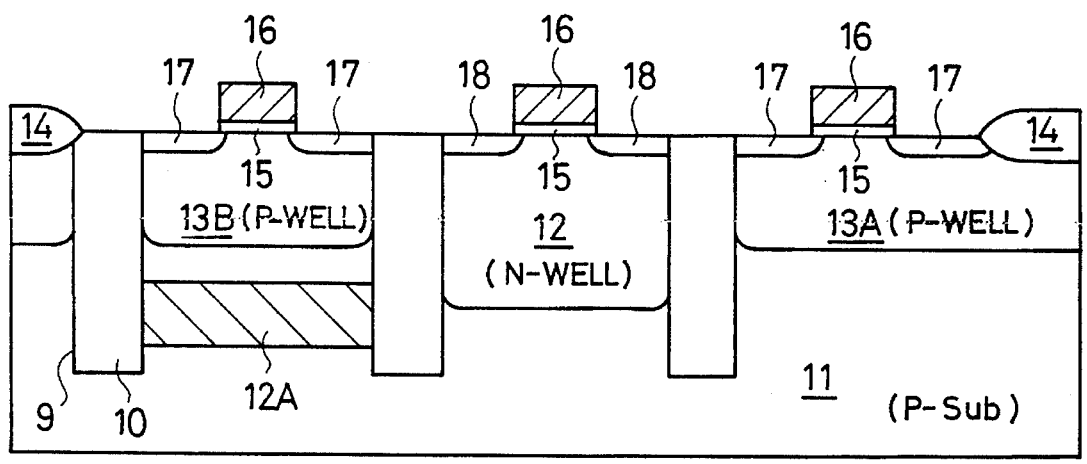

Finally, with reference to FIG. 2D, there are shown MOSFET structures. In the case of a memory device, an element-isolating insulator film 14 is formed on a predetermined portion of the surface of the first P-well region 13A, which serves as an element-isolating film for cell region. A gate structure consisting of a gate oxide film 15 and a gate electrode 16 is built on each of the wells. Thereafter, for P type MOSFET P type impurities are implanted into the N-well region 2 to form a source/drain electrode 18. In contrast, for N type MOSFET N type impurities are implanted into the first and the second P-well regions 13A and 13B to form source/drain electrodes 17 for each.

Of course, instead of the P type semiconductor substrate, an N type semiconductor substrate may be used under the condition that the impurity type of the N-well be interchanged with that of the P-well, according to the present invention.

As described hereinbefore, the semiconductor device according to the present invention has trench element-isolating films at boundaries between N-well and P-well for CMOS, which are free of bird's beak, contributing to high integration. In the prior technique a P-well is formed within an N-well and thus, N type impurities become abundant in the P-well, lowering the mobility of the N type MOSFET. In contrast, the present invention forms the P-well directly in a P type semiconductor substrate in the presence of the trench element-isolating films so that the N type impurities become as little as possible, thereby elevating the operating speed of the device.

Other features, advantages and embodiments of the present invention disclosed herein will be readily apparent to those exercising ordinary skill after reading the foregoing disclosures. In this regard, while specific embodiments of the invention have been described in considerable detail, variations and modifications of these embodiments can be efffected without departing from the spirit and scope of the invention as described and claimed.

What is claimed is:

1. A method for fabricating a semiconductor device, comprising the steps of:

etching predetermined areas off a semiconductor substrate of first conductive type, to form trenches for isolating between well regions of different type;

filling said trenches with an insulator film, to form trench element-isolating films;

forming a well region of second conductive type in a first section of said semiconductor substrate sectioned by said trenches;

forming a buried region of second conductive type in a second section of said semiconductor substrate, said second section being adjacent to but isolated electrically from the first section; and forming a first well region of first conductive type in a third section of said semiconductor substrate and a second well region of first conductive type above said buried region in said second section, simultaneously, said third section being adjacent to but isolated electrically from said first section.

2. A method in accordance with claim 1, wherein said well region off second region is about 1.5 to 5.0 μm deep.

3. A method in accordance with claim 1, wherein said buried region of second conductive type is about 1 to 2 μm thick and about 3 to 4.5 μm apart from the upper surface of said semiconductor substrate and is formed by implanting impurities of first conductive type in a concentration off about $10^{16}$ to $10^{18}$ cm$^{-2}$ at an implantation energy of about 700 to 3,000 keV.

4. A method in accordance with claim 1, wherein said first well region of first conductive type and said second well region of first conductive type both are about 1.0 to 4.5 μm deep and have an impurity concentration of $10^{16}$ to $10^{18}$ cm$^{-3}$.

5. A method in accordance with claim 1, wherein said trenches are about 2 to 6 μm deep.

6. A method in accordance with claim 1, wherein said trench element-isolating films are formed only in the peripheral circuit of a semiconductor memory device.

* * * * *